(12) United States Patent
Ventzek et al.

(10) Patent No.: US 12,183,583 B2
(45) Date of Patent: Dec. 31, 2024

(54) REMOTE SOURCE PULSING WITH ADVANCED PULSE CONTROL

(71) Applicant: Tokyo Electron Limited, Tokyo (JP)

(72) Inventors: Peter Lowell George Ventzek, Austin, TX (US); Alok Ranjan, Austin, TX (US); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 17/550,651

(22) Filed: Dec. 14, 2021

(65) Prior Publication Data

US 2023/0187214 A1 Jun. 15, 2023

(51) Int. Cl.
*H01L 21/3065* (2006.01)
*H01J 37/32* (2006.01)
*H01L 21/3213* (2006.01)

(52) U.S. Cl.
CPC .... *H01L 21/3065* (2013.01); *H01J 37/32146* (2013.01); *H01J 37/32357* (2013.01); *H01J 37/32422* (2013.01); *H01J 37/3244* (2013.01); *H01J 37/32449* (2013.01); *H01J 37/32522* (2013.01); *H01L 21/32136* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 10,998,169 B2 | 5/2021 | Ventzek et al. | |
| 2011/0139748 A1* | 6/2011 | Donnelly | H01J 37/32045 216/37 |
| 2013/0105443 A1 | 5/2013 | Banna et al. | |
| 2014/0339980 A1 | 11/2014 | Wu et al. | |
| 2015/0000844 A1 | 1/2015 | Woo | |
| 2017/0256415 A1 | 9/2017 | Kim et al. | |
| 2019/0074163 A1 | 3/2019 | Khaja et al. | |
| 2019/0198301 A1 | 6/2019 | Ma et al. | |

OTHER PUBLICATIONS

K.J. Kanarik et al., "Overview of atomic layer etching in the semiconductor industry", J. Vac. Sci. Technol. vol. A33(2), pp. 020802-1 to 020802-14. (Year: 2015).*

(Continued)

*Primary Examiner* — Jiong-Ping Lu
(74) *Attorney, Agent, or Firm* — Slater Matsil, LLP

(57) ABSTRACT

A method of etching a substrate that includes: generating a first plasma from a first gas flowing into a first chamber by applying a first power pulse to a first electrode located in the first chamber over a first time duration; and forming a recess in a substrate located in a second chamber, the forming including: providing radicals from the first chamber into the second chamber; applying a plurality of second power pulses to a second electrode located in the second chamber during a second time duration to generate a second plasma in the second chamber from a second gas flowing into the second chamber, the first chamber being pressurized higher than the second chamber; and applying a plurality of third power pulses to a third electrode located in the second chamber during a third time duration to accelerate ions of the second plasma.

20 Claims, 10 Drawing Sheets

(56) References Cited

OTHER PUBLICATIONS

Marchack et al., J. Phys. D: Apply Phys. vol. 44, 2011, paper #174011 (year 2011).*
International Search Report and Written Opinion, PCT Application No. PCT/US2022/052747, mailed Apr. 24, 2023, 10 pages.
Lee et al., "Global model of Ar, O2, CI2, and Ar/O2 high-density plasma discharges", American Vacuum Society, Mar./Apr. 1995, pp. 368-380, 13 pages total.
Lee et al., "Role of Etch Products in Polysilicon Etching in High-Density Chlorine Discharge", Plasma Chemistry and Plasma Processing, vol. 16, No. 1, 1996, pp. 99-120, 22 pages total.
Livesey, "Solution methods for gas flow in ducts through the whole pressure regime", Vacuum, Surface Engineering, Surface Instrumentation & Vacuum Technology, Vacuum 76 (2004), pp. 101-107, 7 pages total.
Shinagawa et al., "An experimental and theoretical investigation of rarefied gas flow through circular tube of finite length", Chemical Engineering Science 57 (2002), pp. 4027-4036, 10 pages total.
Varoutis et al., "Rarefied gas flow through short tubes into vacuum", Ameican Vacuum Society, Mar./Apr. 2008, pp. 228-238, 11 pages total.
Varoutis et al., "Simulation of gas flow through tubes of finite length over the whole range of rarefaction for various pressure drop ratios", American Vacuum Society, Nov./Dec. 2009, pp. 1377-1391, 15 pages total.

* cited by examiner

REMOTE SOURCE PULSING WITH ADVANCED PULSE CONTROL

TECHNICAL FIELD

The present invention relates generally to a method of processing a substrate, and, in particular embodiments, to remote source pulsing with advanced pulse control.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components, enabling the manufacture of three-dimensional (3D) devices, such as fin field-effect transistor (FinFET), the gate-all-around field-effect transistor (GAAFET), and 3D NAND memory. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method of etching a substrate that includes: generating a first plasma from a first gas flowing into a first chamber by applying a first power pulse to a first electrode located in the first chamber over a first time duration; and forming a recess in a substrate located in a second chamber, the forming including: providing radicals from the first chamber into the second chamber; applying a plurality of second power pulses to a second electrode located in the second chamber during a second time duration to generate a second plasma in the second chamber from a second gas flowing into the second chamber, the first chamber being pressurized higher than the second chamber; and applying a plurality of third power pulses to a third electrode located in the second chamber during a third time duration to accelerate ions of the second plasma.

In accordance with an embodiment of the present invention, a method of processing a substrate in a plasma processing chamber that includes: flowing a first gas to a remote source (RS) chamber maintained at a first pressure, the RS chamber being connected to a plasma processing chamber; flowing a second gas to the plasma processing chamber maintained at a second pressure, the second pressure being lower than the first pressure; and performing a cyclic process including a plurality of cycles, each cycle of the plurality of cycles including: generating a first plasma of the first gas to generate radicals; providing the radicals to the plasma processing chamber; and performing an etch process in the plasma processing chamber to form a recess in the substrate in the presence of the radicals.

In accordance with an embodiment of the present invention, a plasma processing system including: a remote source (RS) chamber including a gas inlet, a first electrode coupled to a radio frequency (RF) power source, where the first electrode is configured to generate a first plasma including radicals within the RS chamber, and an exit for the radicals; a plenum attached to the exit of the RS chamber, where the plenum is made of a first thermal conductor, and where walls of the plenum include openings for gas flow; and a plasma process chamber connected to the RS chamber through the plenum, the plasma process chamber including: a substrate holder disposed below the plenum; a gas outlet below the substrate holder; a second electrode coupled to a process power source, the second electrode configured to generate a second plasma; a third electrode coupled to a first bias power source, the third electrode configured to accelerate ions of the second plasma; and process chamber walls including a second thermal conductor, where the process chamber walls of the process chamber are thermally coupled to the walls of the plenum.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate schematic timing diagrams for remote source power and a gas flow rate for the remote source chamber during a plasma processing with remote source in accordance with various embodiments, wherein

FIGS. 3A and 3B illustrate schematic timing diagrams for remote source power during a plasma processing with remote source in accordance with alternate embodiments, wherein FIG. 3A illustrates an embodiment with a constant remote source power, and FIG. 3B illustrates another embodiment with two levels of remote source power;

FIGS. 4A and 4B illustrate schematic timing diagrams for process source power and bias source power during a plasma processing with remote source in accordance with various embodiments, wherein FIG. 4A illustrates an embodiment with overlapped power pulse trains, and FIG. 4B illustrates another embodiment with in-phase power pulse trains;

FIGS. 5A and 5B illustrate cross-sectional views of an example substrate during a plasma processing in accordance with various embodiments, wherein FIG. 5A illustrates an embodiment with the saturation of radicals on the substrate, and FIG. 5B illustrates an alternate embodiment with insufficient radical coverage;

FIGS. 6A-6D illustrate process flow charts of plasma processing methods with remote source in accordance with various embodiments, wherein FIG. 6A illustrates an embodiment process flow, FIG. 6B illustrates another embodiment comprising a cyclic process, FIG. 6C illustrates an example etch process of the cyclic process of FIG. 6B, and FIG. 6D illustrates an alternate embodiment process flow.

DETAILED DESCRIPTION OF ILLUSTRATIVE EMBODIMENTS

This application relates to a system and method of plasma processing during semiconductor device fabrication, more particularly to remote source (RS) mediated plasma etch processing with advanced pulse control, where a RS is used to supply radicals to a plasma processing chamber. In fabrication of 3D semiconductor devices such as FinFET, a plasma etch processing may encounter various convoluted challenges such as line edge roughening, critical dimension (CD) loss, and aspect ratio dependent etching (ARDE) among others. Due to the complexity of plasma etch processing, optimizing process parameters for some metrics may exacerbate other metrics. For example, low pressure and low duty cycle conditions may be desired for sufficient ion verticality for anisotropic etch and less by-product redeposition. However, such conditions can often cause radical starvation during the process and lead to loss of profile control and etch rate. Embodiments of the present application disclose methods of plasma etch processing with a combination of advanced pulse control and a RS that provides radicals to enable conformal radical coverage.

The methods described in this disclosure enables providing sufficient radicals from the remote source (RS) to the plasma processing chamber, and may advantageously improve ion verticality and thereby anisotropy of the plasma etch processing. The anisotropy may be improved because the conformal surface coverage of neutral species (e.g., radicals) on a substrate may passivate sidewalls of the features. Therefore, critical dimension (CD) loss during the plasma etch processing may be reduced in accordance with various embodiments. In addition, the vertical etch rate may also be maximized by minimizing the loss of ion energy at the sidewalls. Further, the methods herein can tune the ratio of neutral flux to ion flux without substantially changing the conditions of the plasma processing chamber (e.g., pressure or duty cycle). For example, various embodiments advantageously increase the flux of neutral species without requiring pressure throttling of the plasma processing chamber. To further improve the process efficiency by the embodiment methods, a set of different power pulse trains may be used to power the RS and the plasma processing chamber independently. Consequently, the methods herein enables low pressure plasma etch processing to etch a recess feature with a high aspect ratio (HAR) that is useful in various 3D semiconductor devices. In addition, the embodiment methods may also be beneficial to mitigate aspect ratio dependent etching (ARDE).

Figure 2A:
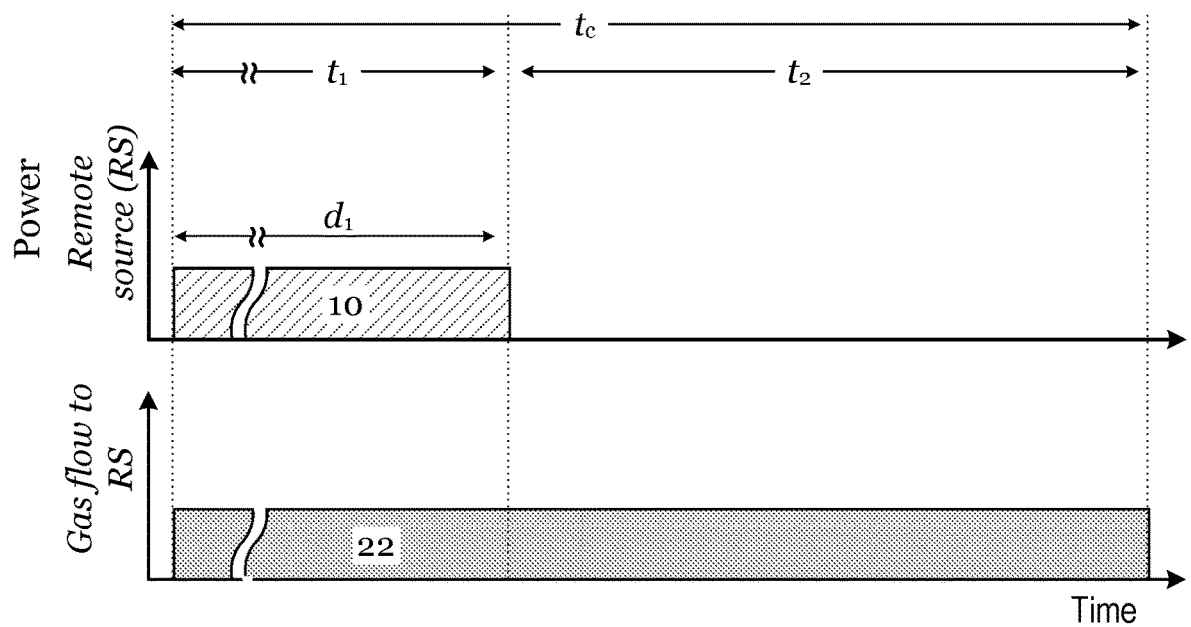
Figure 2B:
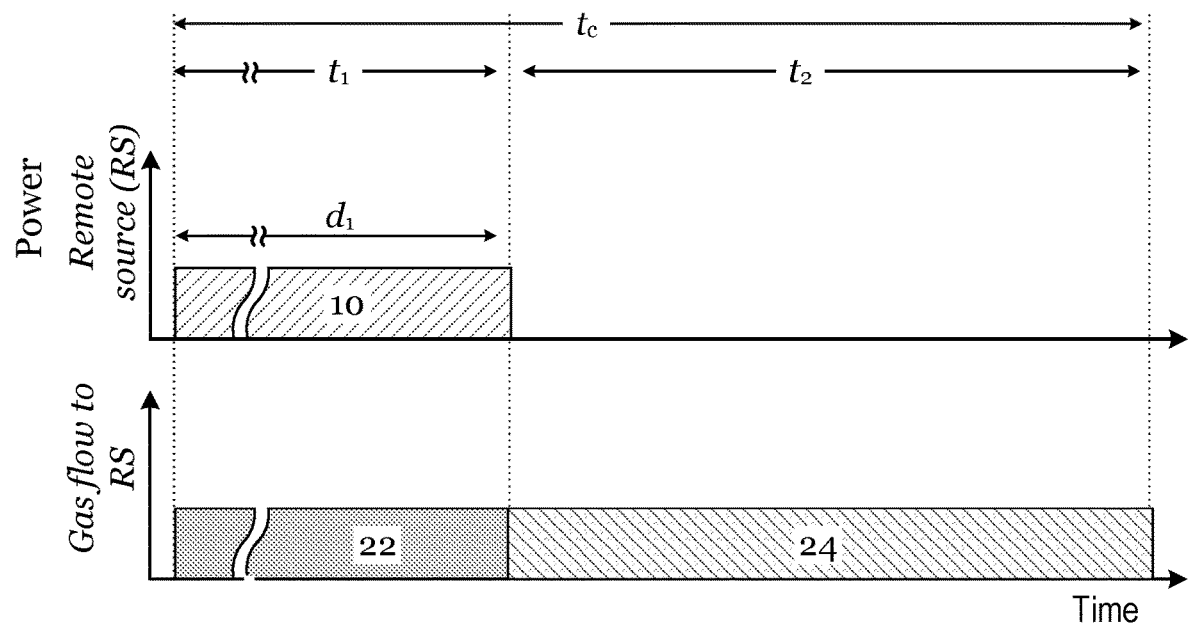
Figure 3A:
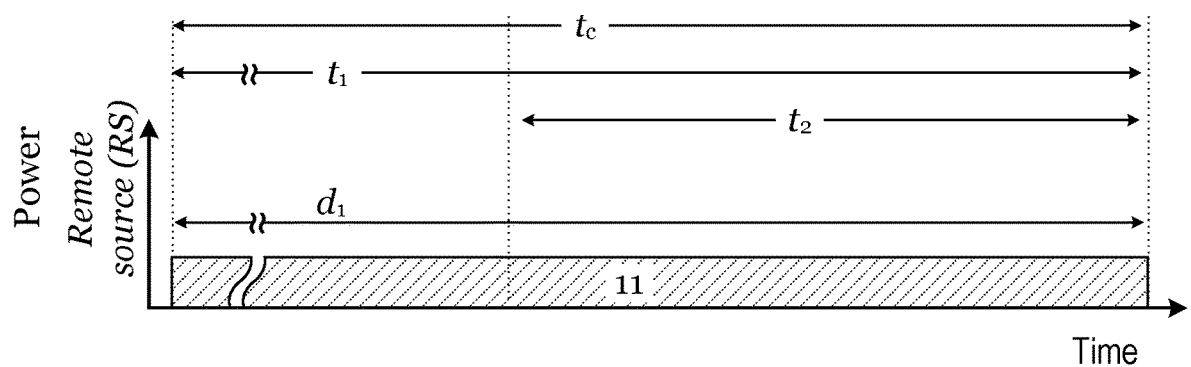
FIG. 3A illustrates an embodiment with one gas composition.
Figure 3B:
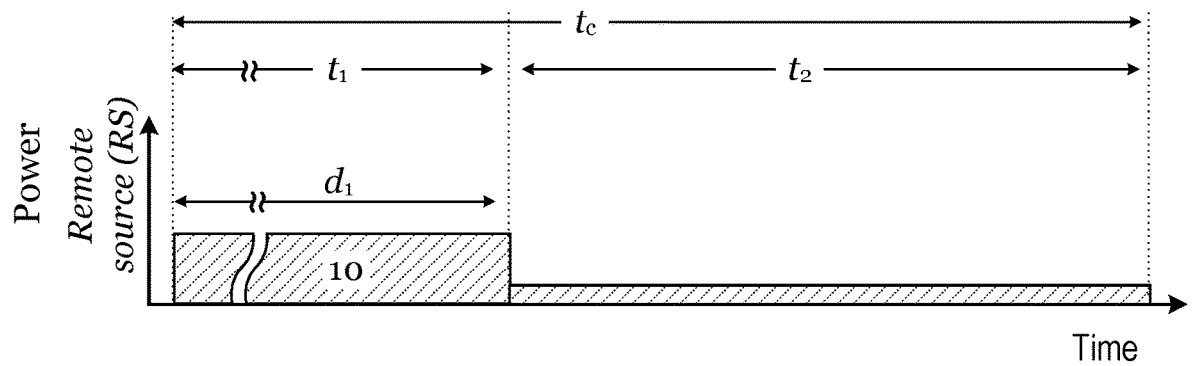
FIG. 3B illustrates another embodiment with two gas compositions.

In the following, FIG. 1A first illustrates an exemplary RS mediated plasma etch processing in accordance with various embodiments with an example time diagram. The corresponding radical density and ion density are described referring to FIG. 1B. In FIGS. 2A-2B, gas flow control for the RS is described. Time diagrams for different power pulse trains to power and control plasmas are illustrated in FIGS. 3A-3B for the RS, and FIGS. 4A-4B for a process source (PS) and a bias source (BS). The effect of RS mediated radical saturation on the ion verticality is described referring to FIGS. 5A-5B. Example process flow diagrams are then illustrated in FIG. 6A-6D. FIG. 7 provides an example plasma system equipped with the RS for performing a process of semiconductor fabrication in accordance with various embodiments. As described more in detail referring to FIG. 7, a plasma system for the RS mediated plasma etch processing may comprise three sections: a RS chamber, a plenum comprising the radical ballast region, and a plasma processing chamber. All figures are drawn for illustration purpose only and not to scale.

The remote source (RS) mediated plasma etch processing in accordance with various embodiments comprises a passivation phase and an etch phase. The passivation phase may comprise generating radicals in a RS chamber and transporting the radicals from the RS chamber to a plasma processing chamber through the radical ballast region. In various embodiments, during the passivation phase, a first plasma may be generated in the RS chamber to generate the radicals. The first plasma may be generated by applying a RS pulse to a coupling element (e.g., coils of a helical resonator) of the RS chamber to generate the first plasma. Next, the etch phase may comprise generating a second plasma in the plasma processing chamber (i.e., a generation phase), accelerating the ions of the second plasma (i.e., an ion energy phase) and exposing a substrate to the accelerated ions of the second plasma to form a feature (e.g., a recess) in the substrate under the presence of the radicals provided from the RS chamber. The generation phase may comprise applying one or more PS pulses to a coupling element of the plasma processing chamber. The ion energy phase may comprise applying one or more BS pulses to a substrate holder of the plasma processing chamber to direct the ions toward a substrate supported by the substrate holder. Further, during the etch phase, a third phase (i.e., a by-product management phase) may be utilized, when the PS power and/or BS power are off or reduced to allow control of by-products within the plasma processing chamber.

In various embodiments, the above steps of the RS mediated plasma etch processing may be performed by using, for example, a set of power pulse trains as described further in detail below.

Figure 1A:
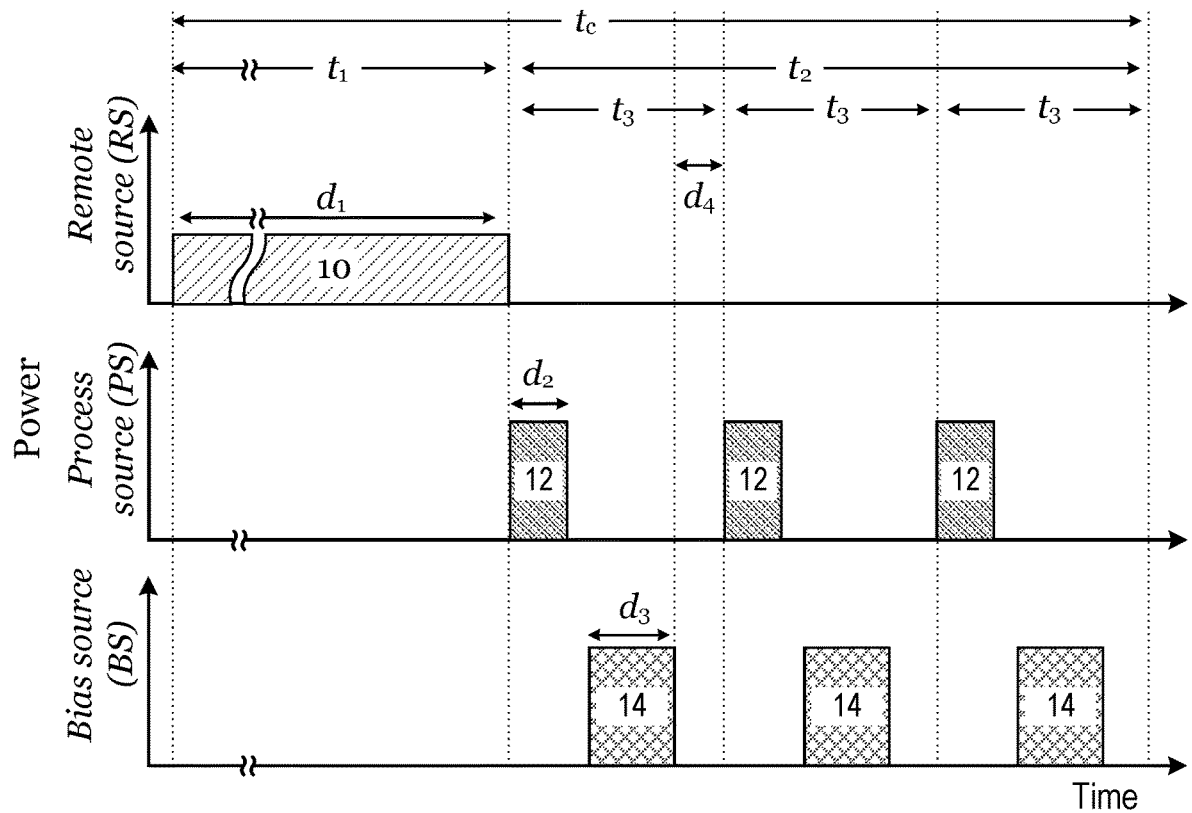
FIG. 1A illustrates a schematic timing diagram for three process parameters of an example remote source mediated plasma etch processing (i.e., remote source power, process source power, and bias source power) in accordance with various embodiments.

FIG. 1A illustrates a schematic timing diagram for three process parameters of an example plasma processing in accordance with various embodiments.

Figure 1B:
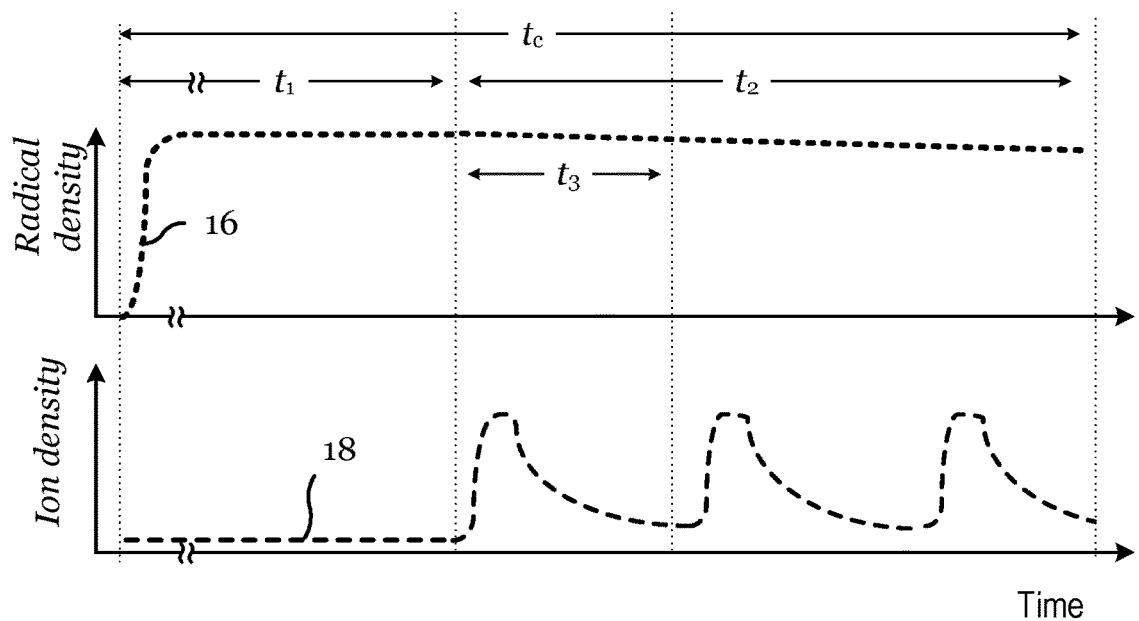
FIG. 1B illustrates a corresponding qualitative graph of radical density and ion density during the example plasma processing of FIG. 1A.

FIG. 1B illustrates a corresponding qualitative graph of radical density and ion density during the example plasma processing of FIG. 1A.

In FIG. 1A, the timing diagram illustrates RS power in the RS chamber, and process source (PS) power and bias source (BS) power in the plasma processing chamber. Time period $t_c$ represents one cycle of the plasma processing comprising a passivation phase ($t_1$) and an etch phase ($t_2$). During the passivation phase ($t_1$), while flowing a first gas to a RS chamber, a RS may be powered to generate radicals by applying a RS power pulse 10 to a RS electrode of the RS chamber for a pulse period $d_1$ as illustrated in FIG. 1A. In various embodiments, by applying the RS power pulse 10, a first plasma having a high radical density may be generated. In certain embodiments, the RS power pulse 10 may comprise a power pulse train. The pulse period $d_1$ may approximately be set at a scale of residence time of the formed radicals. The residence time of the formed radicals depends on various parameters such as gas flow rates, pressure, the volume of the RS chamber, and sticking coefficients of radical species to the walls of the RS chamber. In various embodiments, the pulse period $d_1$ may be between 1 ms to 5 sec, and in other embodiments between 0.1 sec to 2 sec.

In various embodiments, the pressure of the RS chamber may be maintained between 100 mTorr to 5 Torr, and in other embodiments between 0.5 Torr to 2 Torr. The RS chamber pressure may advantageously selected to enable forming a radical-rich plasma in the RS chamber. The radicals generated in the RS chamber may be transported to a plasma processing chamber holding a substrate. Accordingly, the radical density 16 in the plasma processing chamber increases significantly and is maintained during the passivation phase ($t_1$) as illustrated in FIG. 1B. In various embodiments, the transport of the radicals may be driven or assisted by a pressure difference between the RS chamber and the plasma processing chamber. Therefore, the pressure of the plasma processing chamber may advantageously be maintained lower than that of the RS chamber. In various embodiments, the pressure of the plasma processing chamber may be maintained at between 5 mTorr to 200 mTorr, and in certain embodiments between 10 mTorr to 100 mTorr. In other embodiments, the pressure may be 5 mTorr or lower to further suppress the effect of by-product redeposition or aspect ratio dependent etching (ARDE). The capability of providing sufficient radical to the plasma processing chamber while maintaining a relatively low chamber pressure such as 100 mTorr or lower can be one of the advantages for the RS mediated plasma etch processing over conventional techniques that may suffer radical starvation at such a low chamber pressure.

The first gas flowed into the RS chamber may comprise any gas useful in plasma etching. In various embodiments, the first gas comprises a fluorocarbon such as $CF_4$, $C_4F_8$, $C_4F_6$, $CH_3F$, $CHF_3$, or $CH_2F_2$, while in other embodiments, the first gas comprises a halogen-containing gas such as $F_2$, $SF_6$, $Cl_2$, $Br_2$, or HBr. Yet in other embodiments, the first gas may comprise oxygen-containing gas such as dioxygen ($O_2$) or noble gas such as helium (He), argon (Ar), or krypton (Kr). The first gas may be a gas mixture in various embodiments. Further, as further described in FIG. 2B below, the composition and/or the gas flow rate of the first gas may be changed during the RS mediated plasma etch processing.

Next, during the etch phase ($t_2$), while flowing a second gas to the plasma processing chamber, a process source (PS) and a bias source (BS) of the plasma processing chamber may be powered to generate a second plasma (i.e., a processing plasma for etching) and to accelerate the ions of the second plasma, respectively. In certain embodiments, for better process reliability, there may be a gap ($t_{delay}$) between the passivation phase ($t_1$) and an etch phase ($t_2$). An embodiment with no gap is illustrated in FIG. 1A. The etch phase ($t_2$) may comprise a generation phase when the second plasma is generated and powered by the PS and an ion energy phase when the ions of the second plasma are accelerated by the BS. These two phases of the generation phase and the ion energy phase may be separated (anti-phased, e.g., FIG. 1A), partially overlapped (e.g., FIG. 3A), or fully overlapped (in-phase, e.g., FIG. 3B).

The second gas flowed into the plasma processing chamber may comprise any gas useful in plasma etching. The second gas may have a same composition as the first gas in some embodiment, although it may be different in other embodiments. For example, the first gas may comprise a reactive gas such as fluorocarbon and the second gas may comprise an inert gas so that the first gas enables sidewall passivation and/or etching while the second gas provides energy directed to an etch front. In certain embodiments, the second gas may comprise a noble gas such as He, Ar, or Kr. In one embodiment, the first gas and the second gas may comprise a same gas component in order to deliver reactive ions to the etch front. Such an embodiment may also be useful in generating polymerization species that may be deposited over the substrate to compensate for the loss of an etch mask due to sputtering.

In one embodiment, the second gas may be Ar and used for a process with a thick etch mask (e.g., a carbon hard mask with the thickness of a few μm or larger), where no compensation for the etch mask is needed. In another embodiment, the second gas may comprise 90% Ar and 10% $C_4F_6$, and a polymer may be deposited over the etch mask. In yet another embodiment, the second gas may comprise 10% Ar and 90% $C_4F_6$, which promotes further deposition of the polymer.

For powering the PS and the BS, a set of power pulses may be applied. In various embodiments, the power pulse for powering the PS may comprise a PS power pulse train 12 having a pulse period $d_2$ and a fist PS power level and the power pulse for powering the BS may comprise a BS power pulse train 14 having a pulse period $d_3$ and a first BS power level. In FIG. 1A, as an illustrative example, the PS power pulse train 12 and the BS power pulse train 14 both have a same frequency $1/t_3$. In other words, one on-off cycle of the PS pulse and the BS pulse has a period $t_3$. However, different frequencies may be used for the PS power pulse train 12 and the BS power pulse train 14. Further, although three on-off cycles ($t_3 \times 3$) are illustrated within the period of the etch phase ($t_2$) in FIG. 1B for illustration purpose, any number of on-off cycles may be performed during the etch phase. In certain embodiments, the etch phase ($t_2$) may comprise 100 to 1000 cycles. In other embodiments, the PS power pulse train 12, the BS power pulse train 14, or both may have a frequency between 1 kHz to 5 kHz.

In various embodiments, the PS power pulse train 12, the BS power pulse train 14, or both may have a variety of duty cycles (the ratio of on-time to the duration of one on-off cycle), for example, between 3% to 95%. In certain embodiments, the duty cycle for the PS power pulse train, the BS power pulse train, or both may be between 3% to 20%.

In various embodiments, the pulse period $d_2$ of the PS power pulse train 12 may be between 0.1 μs to 100 μs and in certain embodiments between 1 μs to 20 μs.

In various embodiments, the pulse period $d_3$ of the BS power pulse train 14 may be between 1 μs to 200 μs and in certain embodiments between 5 μs to 100 μs.

In addition to the two phases (i.e., the generation phase and ion energy phase), the etch phase ($t_2$) may further comprise a by-product management phase $d_4$ as illustrated in FIG. 1A. The by-product management phase may be performed to tune the degree of redeposition of by-products on the features. In various embodiments, during the by-product management phase, the process source (PS) power may be changed to a second PS power level that is less than the first PS level, and the bias source (BS) power may be changed to a second BS power level that is less than the first BS level. In certain embodiments, as illustrated in FIG. 1A, the second PS level and the second BS level may be zero (i.e., the PS power and the BS power are off). The by-product management phase $d_4$ may have any reasonable duration. In certain embodiments, $d_4$ maybe 1 ms or longer to ensure the removal of any undesired species from the substrate. In other embodiments, the by-product management phase may be skipped (i.e., $d_4$ in FIG. 1A equals to zero). In various embodiments, the by-product management phase may be inserted at any reasonable timing during the RS mediated plasma etch processing. For example, the by-product management phase may be inserted after each pulse of the BS power pulse train 14 as illustrated in FIG. 1A, or only after multiple pulses of BS power pulse train 14.

In FIG. 1B, the ion density 18 in the plasma processing chamber rises repeatedly, corresponding to the timing of the generation phase (i.e., powering the PS at the first PS power level) during the etch phase, and decays after the generation phase (e.g., during the ion energy phase and the by-product). Three repeated peaks of the ion density 18 are illustrated corresponding to three cycles of generation phase. Conditions for the power pulse trains such as frequencies may be selected to provide an optimal plasma condition. For instance, the second generation phase may be started once the ions available for etching are depleted at the end of the first cycle (e.g., at the end of first ion energy phase or first by-product management phase).

On the other hand, the radical density 16 in the plasma processing chamber may be maintained relatively constant with only a gradual decrease during the etch phase ($t_2$). It should be noted that, the fractional decrease of the radical density 16 in the illustrated time scale (e.g., less than 1 ms for several PS-BS power cycles) may be insignificant, for example, being less than 5%. The relatively constant radical density 16 is possible due to relatively long residence time of the radicals (e.g., 1 ms to 1 sec) compared to the short time scales of one cycle $t_3$ (e.g., less than 1 ms). Therefore, in various embodiments, hundreds of cycles may be performed after one passivation phase under a radical-rich condition. Once the radical density 16 decreases below a desired level (e.g., less than 70% of the highest level), the etch phase may be terminated and another passivation phase may be performed to replenish the radicals in the plasma processing chamber. Accordingly, the remote source (RS) mediated plasma etch processing in this disclosure may be performed cyclically by repeating the passivation phase ($t_1$) and the etch phase ($t_2$).

FIGS. 2A and 2B illustrate schematic timing diagrams for remote source (RS) power and a gas flow rate for the RS chamber during a RS mediated plasma etch processing in accordance with various embodiments.

In FIG. 2A, the gas flow rate of the first gas is maintained at constant during both the passivation phase ($t_1$) and the etch phase ($t_2$). The gas flow rate may be changed between $t_1$ and $t_2$ in certain embodiments. Maintaining an appropriate pressure in the RS chamber is essential to prevent a back flow from the plasma processing chamber to the RS chamber. In the illustrated example, a first composition of the first gas 22 is kept unchanged.

In FIG. 2B, on the other hand, the first composition of the first gas 22 may be flown during the passivation phase ($t_1$), and a second composition of the first gas 24 may be flown during the etch phase ($t_2$) at the same gas flow rate. In certain embodiments, the first composition of the first gas 22 may comprise a reactive gas such as a fluorocarbon and the second composition of the first gas 24 may comprise an inert gas such as a noble gas. Switching to the inert gas flow for the RS chamber during the etch phase ($t_2$) may help reducing introducing species of the reactive gas of the first composition that are not dissociated to the plasma processing chamber. The gas composition of the first gas and/or the gas flow rate may be changed at any reasonable stage during the RS mediated plasma etch processing.

The remote source (RS) mediated plasma etch processing may advantageously be performed as an isobaric continuous process without pressure throttling of the plasma processing chamber. In contrast, conventional etch techniques comprising multiple stages such as atomic layer etching (ALE) may require pressure throttling, which complicates and slows the process. Therefore, the RS mediated plasma etch processing may eliminates some of the steps to change conditions required in conventional etch techniques and improve the process efficiency.

In addition to the embodiments described above, various combinations of power pulse trains may be used for the remote source (RS), the process source (PS), and the bias source (BS) as illustrated in FIGS. 3A-3B and 4A-4B. Examples for powering the RS are described referring to FIGS. 3A-3B, and those for powering the PS and the BS are described referring to FIGS. 4A-4B.

FIGS. 3A and 3B illustrate schematic timing diagrams for RS power during a plasma processing with RS in accordance with alternate embodiments. Any suitable pulsing patterns and conditions may be used for powering the PS and the BS.

In FIG. 3A, instead of using a power pulse, the RS in the RS chamber is powered by applying a constant RS power 11. Accordingly, in such embodiments, the passivation phase ($t_1$) may extend to the entire time period $t_c$ for one cycle of the plasma processing, and overlaps with the etch phase ($t_2$). By applying the constant RS power 11, the radicals may be generated constantly in the RS chamber during the entire duration of the plasma processing.

In FIG. 3B, the remote source (RS) power pulse 100 may comprise a RS power pulse train having two non-zero RS power levels. In prior embodiments illustrated in FIG. 1A, the RS power is on only during the passivation phase ($t_1$). In contrast, in these embodiments, when the plasma processing proceeds from the passivation phase ($t_1$) to the etch phase ($t_2$), the RS power is reduced from a first RS power level to a second RS power level that is lower than the first RS power level. Not shutting off the RS power completely during the etch phase may be beneficial in resuming radical generation in a next cycle (i.e., the passivation phase) and/or reliably reigniting a plasma. In certain embodiments, more complex RS power pulse train patterns may be used for powering the RS.

Figure 4A:
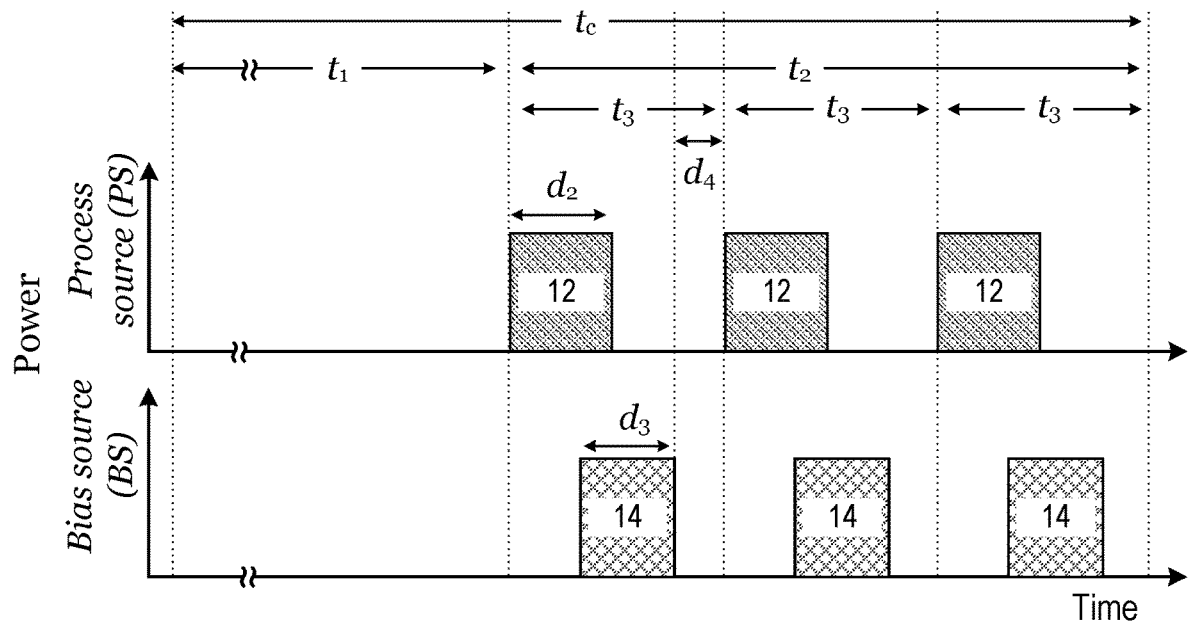
Figure 4B:
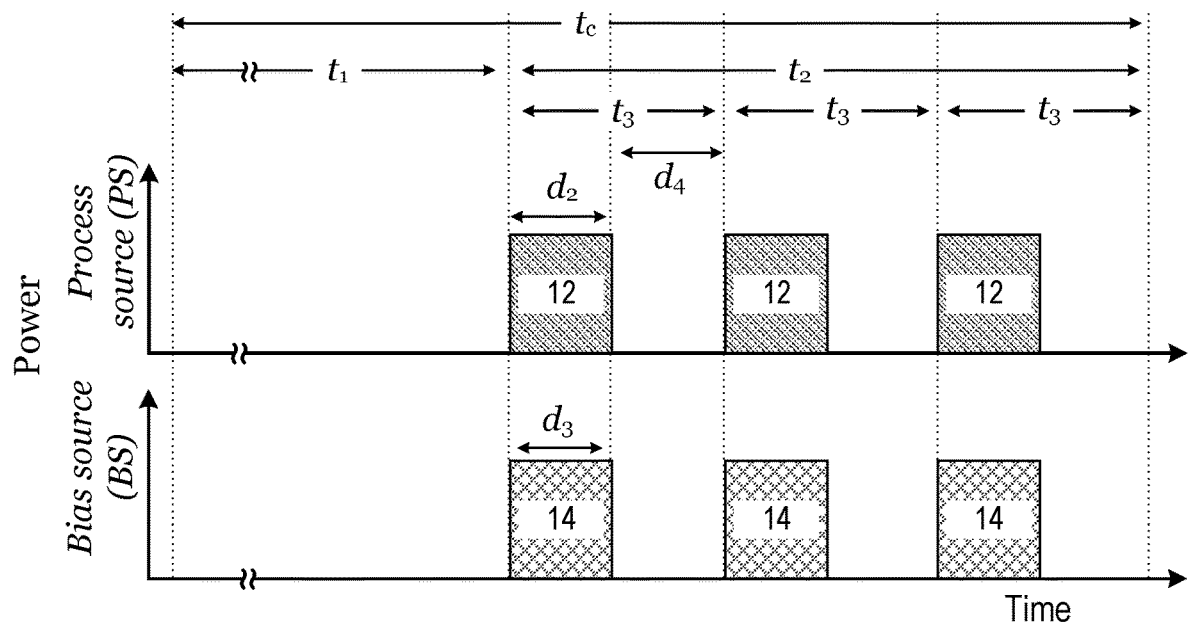

FIGS. 4A and 4B illustrate schematic timing diagrams for process source (PS) power and bias source (BS) power during a plasma processing with RS in accordance with various embodiments. Any suitable pulsing patterns and conditions may be used for powering the RS.

In FIG. 4A, power-on periods of the PS power pulse train 12 and the BS power pulse train 14 are partially overlapped. In other words, the generation phase (when the PS is on) and the ion energy phase (when the BS is on) are partially overlapped. Partially overlapping the two phases may advantageously allow fine adjustment of the plasma conditions by enabling three different power conditions (i.e., powered by PS-only, PS and BS, and BS-only).

In FIG. 4B, power-on periods of the PS power pulse train 12 and the BS power pulse train 14 are fully overlapped, where the pulse period $d_2$ of the PS power pulse train 12 and the pulse period $d_3$ of the BS power pulse train 14 are identical and synchronized. Accordingly, the generation phase and the ion energy phase are fully overlapped (in-phase), which may advantageously simplify the process and reduce the number of process parameters. Such an embodiment may lead to a higher ion temperature and thereby some etching in a lateral direction. A lateral etch to an extent may be beneficial because it may help cleaning the sidewalls by removing some by-product redeposition. In a similar way, it may help preventing a clogging issue or feature pinch off, especially when a substantial passivation is employed at and near the top of a high aspect ratio contact (HARC) structure.

Further, in other embodiments, more complex combinations of PS and RS power pulse train patterns. For example, multi-frequency RF power may be used for powering the BS (i.e., more than one pulse trains are used simultaneously for powering the BS). In addition, instead of turning off the PS and/or the BS completely, switching between two or more non-zero PS and/or BS power levels may be used for power pulse trains. Using multiple PS and/or BS power levels may be particularly beneficial to finely adjust the by-produce management phase.

In accordance with various embodiments described above, the RS mediated plasma etch processing enables maintaining a high level of the radical density 16 in the plasma processing chamber. Consequently, the substrate is flooded with the radicals and the surface of the substrate may be saturated with the radicals. This RS mediated radical saturation may be substantially beneficial to maintain ion verticality as illustrated in FIGS. 5A and 5B.

Figure 5A:
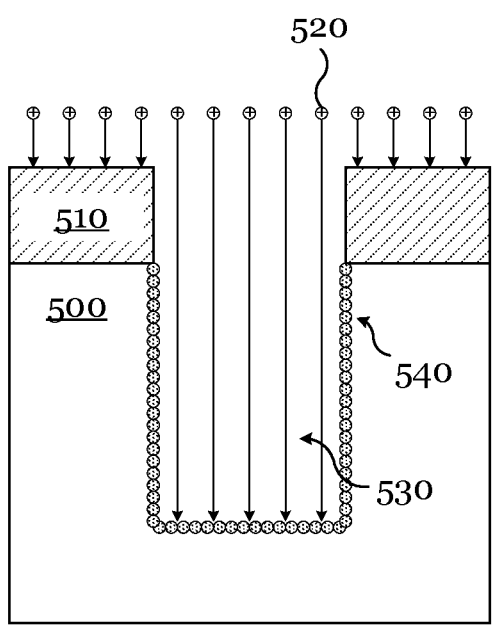
Figure 5B:
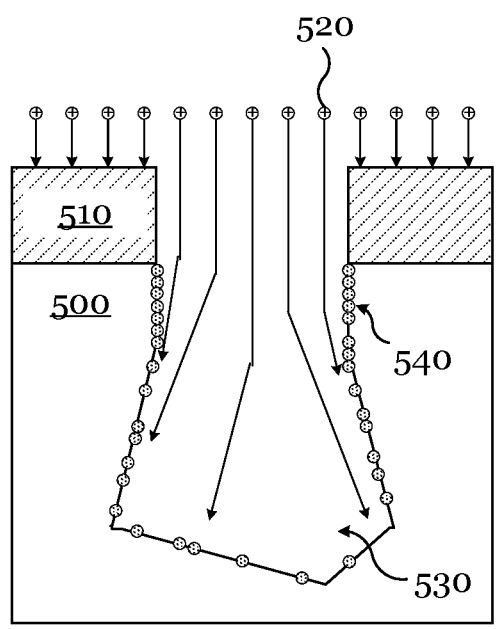

FIGS. 5A and 5B illustrate cross-sectional views of an example substrate 500 during a plasma processing in accordance with various embodiments.

The substrate 500 comprise a semiconductor substrate in various embodiments. In one or more embodiments, the substrate 500 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate 500 comprises heterogeneous layers such as silicon germanium on silicon, gallium nitride on silicon, silicon carbon on silicon, as well layers of silicon on a silicon or SOI substrate.

In FIG. 5A, a etch mask layer 510 is deposited over the substrate 500 with a pattern. An ideal etch profile with perfectly vertical sidewalls is illustrated resulting from a plasma etching process utilizing positively charged ions 520 to etch a recess 530 in the substrate 500. The plasma etch processing may fabricate the recess 530 with a high aspect ratio (HAR). Features with aspect ratio (ratio of height of the feature to the width of the feature) higher than 50:1 are generally considered to be high aspect ratio features, and in some cases fabricating a structure comprising a higher aspect ratio such as 100:1 may be desired for advanced 3D semiconductor devices, for example contacts and other staircase structures for memory device. In this scenario, radicals 540 are saturated on the sidewalls of the recess 530 forming a uniform surface layer that serves as a passivation layer during the etch. This can be realized by supplying sufficient radicals generated in the RS chamber to the plasma processing chamber as described above. Because the radicals 540 are electronically neutral species, saturating the sidewalls with the radicals 540 can prevent surface charging, and thereby allowing influx of the positively charged ions 520 to maintain its verticality and reach to the etch front with minimal energy loss. In other words, with the RS mediated radical saturation, a highly anisotropic etch can be achieved without compromising the etch rate. Further, it is well known to the person of ordinary skill in the art that the structure of a 3D semiconductor device may comprise more than one AR. It is therefore useful to have the uniform surface layer with conformality as illustrated in FIG. 5A for maintaining the same etch performance at different depths of features (e.g., features with different AR). Accordingly, the method herein may be advantageous in mitigating the issue of aspect ratio dependent etching (ARDE).

In FIG. 5B, on the other hand, a scenario with insufficient radical coverage on sidewalls is illustrated. When the radical density in the plasma processing chamber is not sufficiently high (e.g., radical-starved, ion-rich regime), the sidewalls of the recess 530 may not be saturated with the radicals 540, and thereby causing some portions of the sidewalls to be negatively charged. Consequently, the collision of the positively charged ions 520 to the sidewalls may lead to a lateral etch and the ion verticality may be impaired. This effect may result in uneven etch rate in the recess 530, particularly on the sidewalls, and thereby feature distortions may occur as illustrated. This issue of radical starvation is one of the challenges for conventional plasma etch techniques, especially when they are operated at a moderate to low pressure (e.g., 100 mTorr or lower). The embodiment methods of this disclosure, however, can advantageously realize radical rich, ion-starved regime as illustrated in FIG. 5A by using the RS mediated plasma etch processing.

FIGS. 6A-6D illustrate process flow charts of plasma processing methods with remote source in accordance with various embodiments. The process flow can be followed with the figures discussed above (e.g., FIGS. 1A and 1B) and hence will not be described again.

Figure 6A:
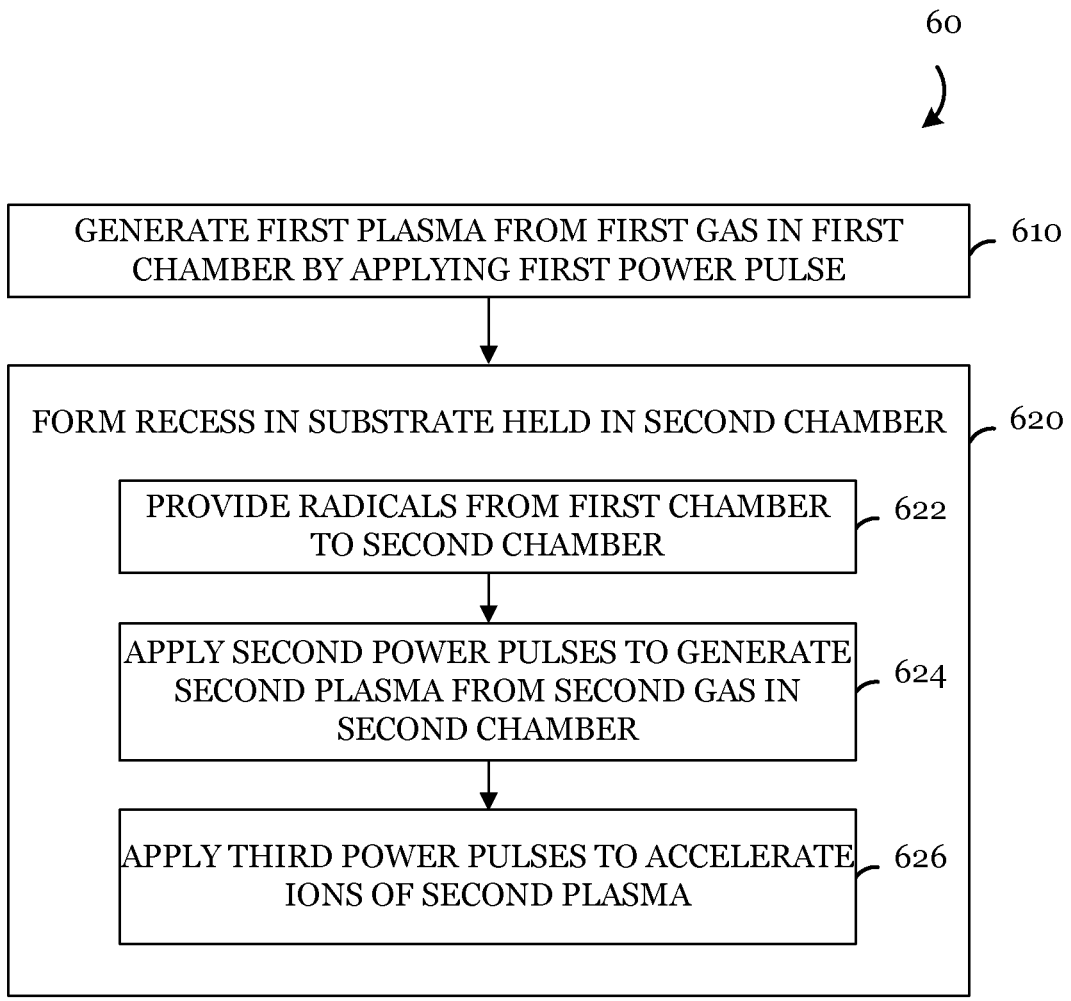
Figure 7:
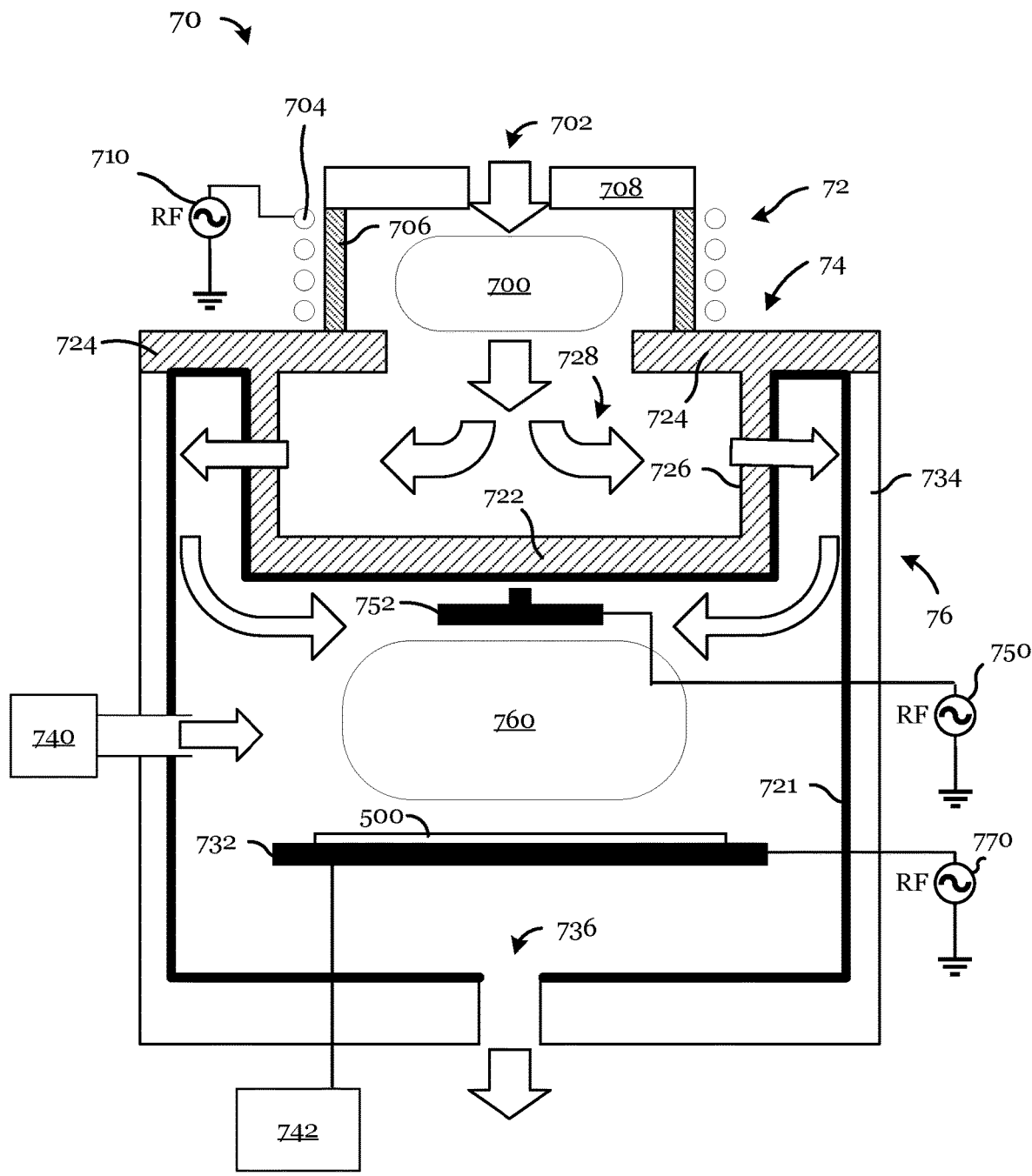
FIG. 7 illustrates a plasma system with a remote radical source for performing a process of semiconductor fabrication in accordance with various embodiments.

In FIG. 6A, a process flow 60 starts with generating a first plasma from a first gas flowing into a first chamber (i.e., a remote source chamber) by applying a first power pulse to a first electrode located in the first chamber over a first time duration (block 610). The first time duration corresponds to the passivation phase (e.g., $t_1$ in FIG. 1A). The next step is to form a recess in a substrate located in a second chamber (i.e., a plasma processing chamber) (block 620). The forming of the recess may comprise providing radicals from the first chamber into the second chamber (block 622), applying a plurality of second power pulses (e.g., the PS power pulse train 12 in FIG. 1A) to a second electrode located in the second chamber to generate a second plasma in the second chamber from a second gas flowing into the second chamber (block 624), and applying a plurality of third power pulses (e.g., the BS power pulse train 14 in FIG. 1A) to a third electrode located in the second chamber to accelerate ions of the second plasma (block 626).

Figure 6B:
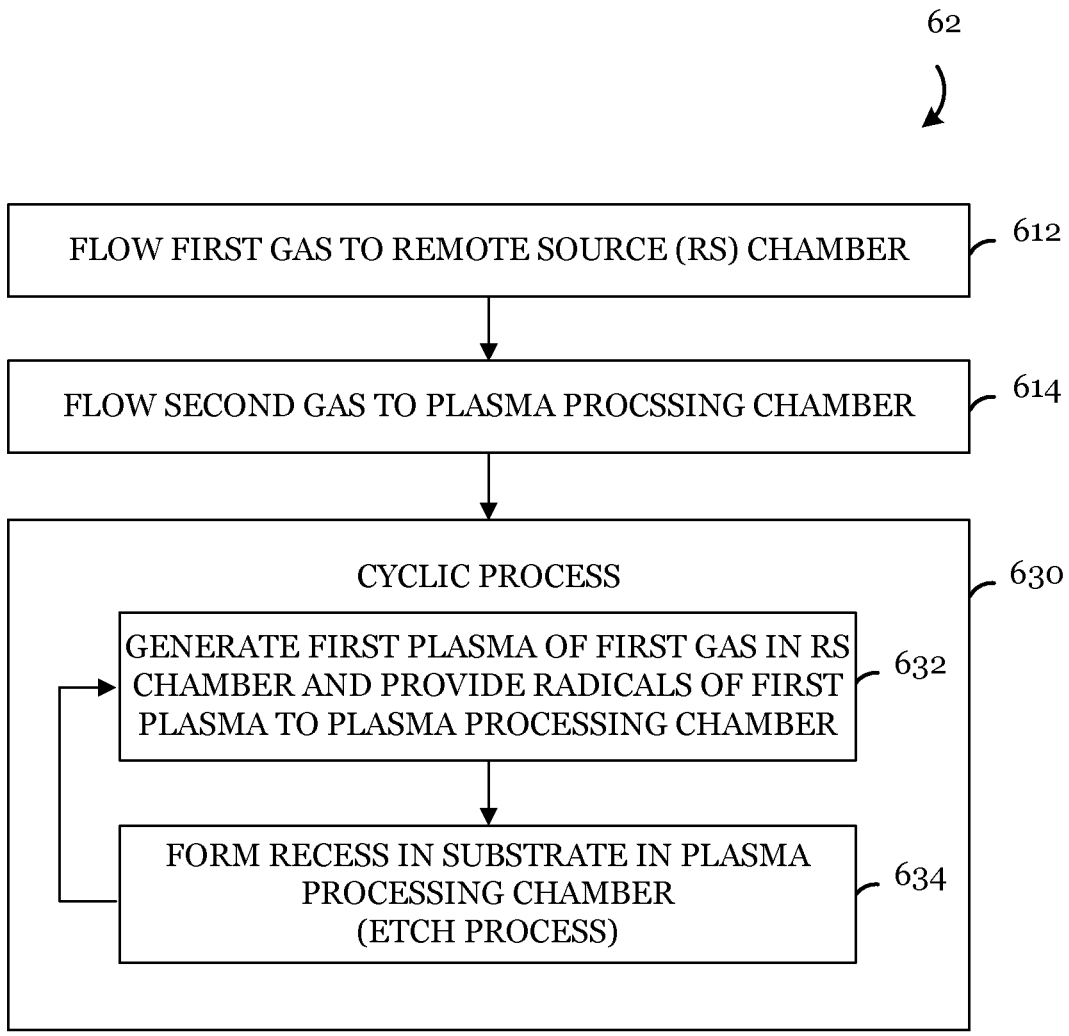

In FIG. 6B, another process flow 62 starts with flowing a first gas to a remote source (RS) chamber maintained (block 612) maintained at a first pressure, followed by flowing a second gas to a plasma processing chamber maintained at a second pressure that is lower than the first pressure (block 614). While flowing these gases, a cyclic process may be performed (block 630): the cyclic process may comprise generating a first plasma of the first gas to generate radicals in the RS chamber and providing the radicals to the plasma processing chamber (block 632) and performing an etch process in the plasma processing chamber to form a recess in the substrate in the presence of the radicals (block 634). These two steps (blocks 632 and 634) may be cyclically repeated to achieve a desired etch profile. In certain embodiments, the etch process (block 634) may be performed by applying a set of power pulse trains as further illustrated in FIG. 6C.

Figure 6C:
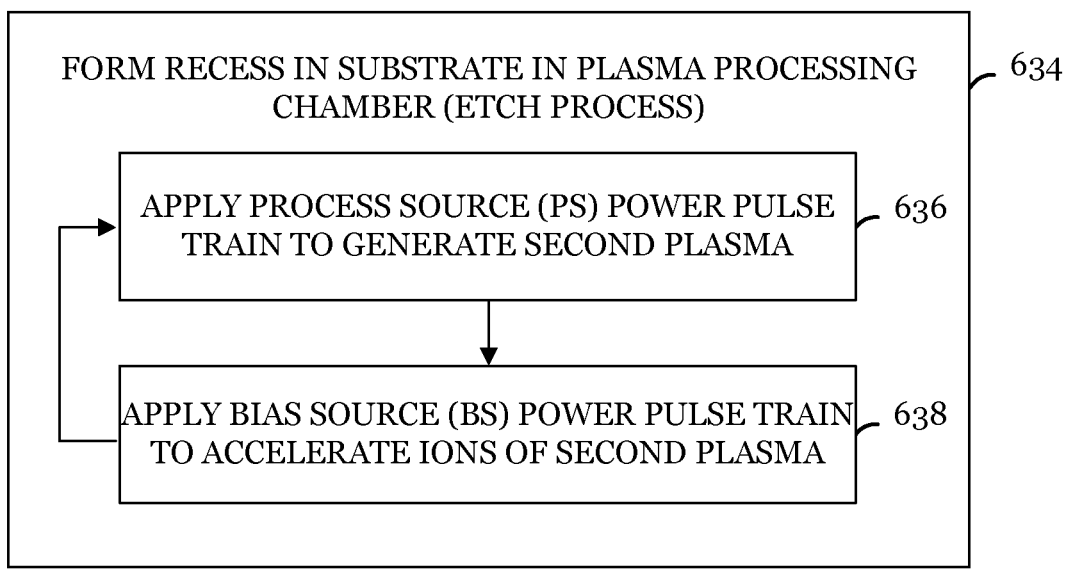

In FIG. 6C, the etch process (block 634) itself may be a cyclic process comprising applying a process source (PS) power pulse train to generate a second plasma in the plasma processing chamber (block 636) and applying a bias source (BS) power pulse train to accelerate ions of the second plasma (block 638).

Figure 6D:
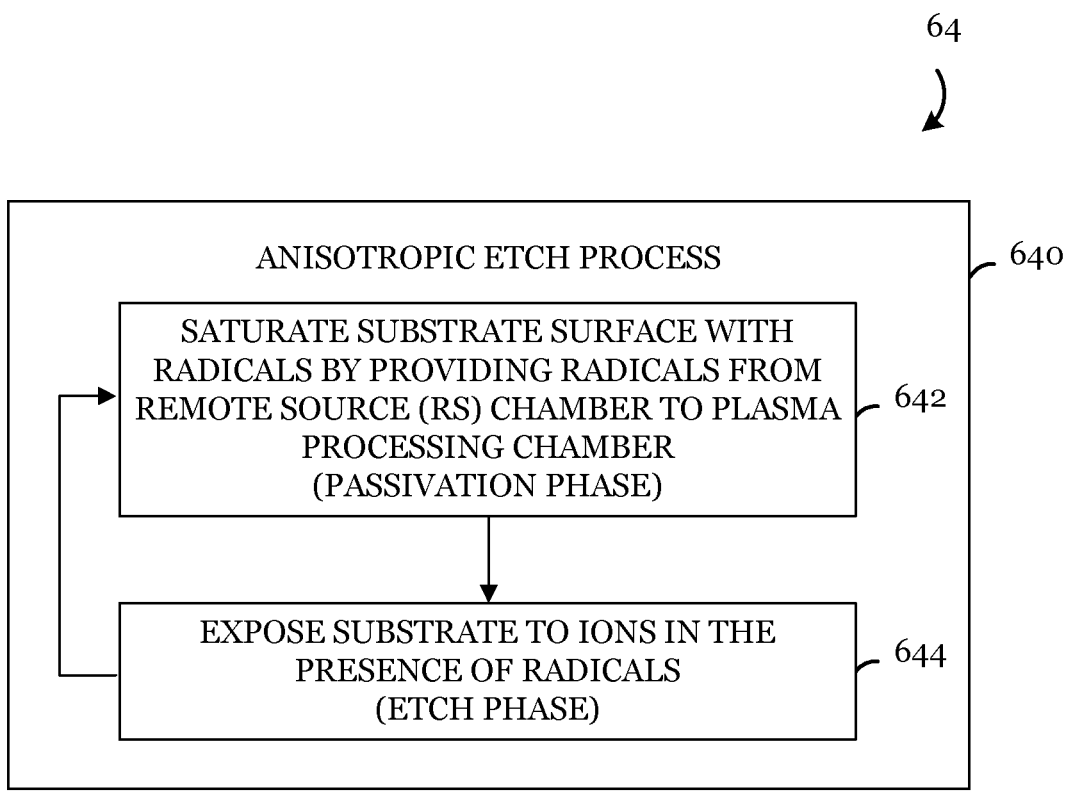

In FIG. 6D, an alternate process flow 54 of an anisotropic etch process (block 640) starts with a passivation phase (block 642), where the surface of a substrate in a plasma processing chamber is saturated with radicals provided from a remote source (RS) chamber. Next, an etch phase (block 644) may be performed by exposing the substrate to ions in the presence of the radicals, where the ions being formed in the plasma processing chamber using a combination of process source (PS) power pulses and bias source (BS) power pulses.

FIG. 7 illustrates a plasma processing system 70 with a remote source (RS) for performing a process of semiconductor fabrication in accordance with various embodiments.

In FIG. 7, the plasma processing system 70 comprises a RS chamber 72, a plenum 74 attached to an exit of the RS chamber 72, and a plasma processing chamber 76 connected to the RS chamber 72 through the plenum 74. Although the RS chamber 72 is illustrated above the plenum 74 and the plasma processing chamber 76 in FIG. 7, other configurations are possible. For example, the RS chamber 72 may be positioned on a side of the plasma processing chamber 76. A first plasma 700 and a second plasma 760 may be generated in the RS chamber 72 and the plasma processing chamber 76, respectively. Gas flows in the plasma processing system 70 are illustrated by block arrows.

The RS chamber 72 may be shaped like an inverted open cylinder having a RS gas inlet 702 in a top cover 708 and a radio frequency (RF) electrode 704 disposed outside a sidewall 706. The RS gas inlet 702 may be configured to introduce the first gas into the RS chamber 72. The RS gas inlet 702 may comprise multiple inlet ports so that more than one gas may be introduced as a gas mixture for the first gas or the composition of the first gas may be changed during the RS mediated plasma etch processing. The RF electrode 704 may be a conductive helix coiled vertically around the sidewall 706 comprising a dielectric (e.g., a ceramic material). The RF electrode 704 may alternatively be positioned near the top cover 708 and shaped like a planar coil. The top cover 708 may comprise a conductive material with a dielectric coating on the side facing the inside of the RS chamber 72, for example, aluminum coated with alumina or yttria. Various gases (e.g., argon, oxygen, sulfur hexafluoride, and tetrafluoromethane, nitrogen trifluoride, and the like) may be introduced in the RS chamber 72 to form controlled gas discharge plasma as a source of radicals.

The RF electrode 704 is coupled to an RF power source 710. The length of the conductor may be designed to be quarter wavelength ($\lambda/4$) or half-wavelength ($\lambda/2$) of an RF electromagnetic oscillation in the electrode powered by the RF power source 710. In various embodiments, the oscillation frequency of the RF power may be about 15 MHz to about 500 MHz and, in certain embodiment about 15 MHz to about 200 MHz. In one embodiment, the frequency of the RF power may be between 20 MHz to 40 MHz, for example 27 MHz. When a resonator helical oil is used for the RF electrode 704, the frequency may be selected in consideration of the coil length such that the coil may sufficiently surround the sidewall 706. In alternate embodiments, the RF electrode 704 may be made of a flat spiral coil and poised above the top cover 708. The RF electrode 704 may be configured to operate in a purely inductively coupled mode to sustain the first plasma 700 with an RF power density of about 0.01 W/cm$^3$ to about 10 W/cm$^3$ within the RS chamber 72.

In the example embodiments in FIG. 7, the RS chamber 72 has an open bottom for the radicals to be transported from the first plasma 700 in a gas flow exiting the RS chamber 72 to a radical ballast region 728 of the plenum 74 attached at the exit. The plenum 74 comprises a bottom wall 722, a sidewall 726 around the edge of the bottom wall 722, a rim 724 extending outwards beyond the sidewall, and the radical ballast region 728 between the sidewall 726 and the bottom wall 722.

Attached to the rim 724 is the plasma processing chamber 76 disposed below the rim 724, as illustrated in FIG. 7. The rim 724 is extending outwards from the sidewall 726 covering the top of the plasma processing chamber 66 and is attached to the vertical section of the walls 734 of the plasma processing chamber 76. In various other embodiments, the rim 724 may extend a part of the way to the edge of the plasma processing chamber 76 and attach to a top cover of the plasma processing chamber 76, or the rim 724 and the walls 734 may be one monolithic structure.

In FIG. 7, the plasma processing chamber 76 comprises an annular region adjacent to the sidewall 726 and extends further below into a cylindrical region adjacent to the bottom wall 722. A substrate holder 732 (e.g., a circular electrostatic chuck (ESC)) may be disposed in the region adjacent below the bottom wall 722 of the plenum 74 and near the bottom of the plasma processing chamber 76. The ESC may be coated with a conductive material (e.g., a carbon-based or metal-nitride based coating) so that electrical connections may be made to the substrate holder 732. For illustrative purposes, a substrate 500 is shown loaded on the substrate holder 732. In one embodiment, the substrate holder 732 may be configured to accommodate the substrate 500 that has a diameter of 300 mm. Accordingly, the plasma processing chamber 76 may have a width between 400 mm to 500 mm in one embodiment. The temperature of the substrate 500 may be maintained by a temperature controller 742. A gas outlet 736 may be disposed below the substrate holder 732 via which excess reactants and gaseous byproducts may be removed from the plasma processing chamber 76. In certain embodiments, the gas outlet 736 may be placed asymmetrically in order to facilitate generation of a desired asymmetric gas flow pattern over the substrate holder 732. A gas inlet 740 may be disposed on the walls 734 of the plasma processing chamber 76 and configured to introduce the second gas to the plasma processing chamber 76. Although the RS gas inlet 702 and the gas inlet 740 are illustrated as a single inlet, they may comprise multiple gas inlets coupled with multiple gas flow controllers. In some embodiments, optional center/edge splitters may be used to independently adjust the gas flow rates at the center and edge of the substrate 500.

As illustrated in FIG. 7, the substrate holder 732 may be a bottom electrode of the plasma processing chamber 76. In the illustrative example in FIG. 7, the substrate holder 732 is connected to an RF-bias power source 770 configured to provide bias power (BS). A conductive circular plate inside the plasma processing chamber 76 near the top is the top electrode 752. In FIG. 7, the top electrode 752 is connected to an RF power source 750 configured to provide process source (PS) power. In some other embodiment, the top electrode may be a conductive coil located outside the plasma processing chamber 76.

The RF-bias power source 770 may be used to supply continuous wave (CW) or pulsed RF power to sustain the second plasma 760. The second plasma 760, shown between the top electrode 752 and the bottom electrode (also the substrate holder 732), exemplifies direct plasma generated close to the substrate 500 in the plasma processing chamber 76 of the plasma processing system 70. Etching may be performed by exposing the substrate 500 to the second plasma 660 while powering the substrate holder 732 with RF-bias power source 770 and the top electrode 752 with the RF power source 750. The conditions for plasmas used in the processing may be selected in consideration of the target material for etching. For a dielectric etch (e.g., SiO$_2$), for example, a low PS power, a short period for the etch phase (t₂), or a low duty cycle may be used. Such a plasma condition may lower the electron density and minimize the cracking of species useful for compensating the loss of an etch mask during the etch process.

RS power or PS power may be supplied as alternating current (AC) power in the radio frequency (RF) range (e.g. high frequency (HF), very high frequency (VHF), and others). BS power may be supplied as direct current (DC) power (e.g. continuous DC power, pulsed DC power, bipolar DC power, etc.) or AC power (e.g. high frequency (HF), medium frequency (MF), low frequency (LF), very low frequency (VLF), etc.). In certain embodiments, the BS power may be supplied by multiple RF sources with multiple frequencies, for example comprising a HF and a LF.

In various embodiments, the frequency of the PS power may be 27 MHz or higher, and in certain embodiments it may be in the very high frequency (VHF) range. For example, the frequency of the PS power may be 60 MHz, 100 MHz, or 200 MHz, which may advantageously allow a low plasma potential and a low PS power. For the BS, any appropriate conditions may be used. In certain embodiments, a RF power with less than 13 MHz or a DC power may be used for the BS to perform a dielectric etch (e.g., $SiO_2$). For a conductor etch (e.g., Si), a RF power with about 13 MHz may be used for the BS. Alternately in the conductor etch, a RF power with 100s kHz to 2 MHz may be used for the BS. The frequency of the BS may be selected in consideration of the voltage (e.g., peak-to-peak voltage Vpp) to be applied. When a low voltage is preferred to minimize undesired damage to the components of a device, a high frequency may be selected. When a relatively high voltage is acceptable for the process, on the other hand, a low frequency may be selected.

For efficient heat dissipation, the walls of the plenum 74, such as the bottom wall 722, the rim 724, and the sidewall 726, and walls 734 of the plasma processing chamber 76 may comprise thermally conductive material such as aluminum, or copper, or the like, and are coupled together both physically and thermally. As known to a person skilled in the art, various electrically conductive walls of a plasma system such as plasma processing system 70 may be electrically connected to the system ground (the reference potential).

A cover layer 721, illustrated in FIG. 7, may be provided by using various techniques, for example, using anodized aluminum, coating with yttria, or conditioning the plasma processing chamber 76. The cover layer 721 may comprise one material for the walls of the plenum 74 and a different material for the walls 734 of the plasma processing chamber 76. Generally, the chemical state of the walls of a plasma process chamber is altered during processing by ion bombardment, and chemical reaction with various radicals and gaseous byproducts. The cover layer 721 provides an additional advantage of reducing such variability of the chemical state of the walls; hence further stabilizing the plasma processing environment.

The configuration of the plasma processing system 70 described above is by example only. In alternative embodiments, various alternative configurations may be used for the plasma processing system 70. For example, inductively coupled plasma (ICP) may be used with RF source power coupled to a planar coil over a top dielectric cover, or capacitively coupled plasma (CCP) generated using a disc-shaped top electrode in the plasma processing chamber 76, the gas inlet and/or the gas outlet may be coupled to the sidewall, etc. In one embodiment, a resonator may be used and configured to be operated at about 27 MHz or higher. In another embodiment, a non-resonant antenna may be used and configured to be operated at about 400 kHz to about 13 MHz. Alternately, a microwave (MW) power may be used. In various embodiments, the RF power, chamber pressure, substrate temperature, gas flow rates and other plasma process parameters may be selected in accordance with the respective process recipe.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of etching a substrate that includes: generating a first plasma from a first gas flowing into a first chamber by applying a first power pulse to a first electrode located in the first chamber over a first time duration; and forming a recess in a substrate located in a second chamber, the forming including: providing radicals from the first chamber into the second chamber; applying a plurality of second power pulses to a second electrode located in the second chamber during a second time duration to generate a second plasma in the second chamber from a second gas flowing into the second chamber, the first chamber being pressurized higher than the second chamber; and applying a plurality of third power pulses to a third electrode located in the second chamber during a third time duration to accelerate ions of the second plasma.

Example 2. The method of example 1, further including maintaining a pressure of the second chamber at 100 mTorr or lower while generating the first plasma and forming the recess.

Example 3. The method of one of examples 1 or 2, further including maintaining a pressure of the first chamber between 100 mTorr to 5 Torr while generating the first plasma and forming the recess.

Example 4. The method of one of examples 1 to 3, where a pulse period of the first power pulse is between 1 ms to 5 sec.

Example 5. The method of one of examples 1 to 4, where a pulse period of the second power pulse is between 1 μs to 20 μs.

Example 6. The method of one of examples 1 to 5, where a pulse period of the third power pulse is between 5 μs to 100 μs.

Example 7. The method of one of examples 1 to 6, where the first time duration and the second time duration are partially overlapped.

Example 8. The method of one of examples 1 to 7, where the plurality of second power pulses and the plurality of third power pulses are not overlapped.

Example 9. The method of one of examples 1 to 8, where each pulse in the plurality of second power pulses or the third power pulses includes a first edge from a first voltage level to a second voltage level, a second edge from the second voltage level to a third voltage level, and a third edge from the third voltage level to the first voltage level, the first edge being separated from the second edge, and the second edge being separated from the third edge.

Example 10. The method of one of examples 1 to 9, further during a fourth time duration, reducing a power level for the second electrode and a power level for the third electrode.

Example 11. A method of processing a substrate in a plasma processing chamber that includes: flowing a first gas to a remote source (RS) chamber maintained at a first pressure, the RS chamber being connected to a plasma processing chamber; flowing a second gas to the plasma processing chamber maintained at a second pressure, the second pressure being lower than the first pressure; and performing a cyclic process including a plurality of cycles, each cycle of the plurality of cycles including: generating a first plasma of the first gas to generate radicals; providing the radicals to the plasma processing chamber; and performing an etch process in the plasma processing chamber to form a recess in the substrate in the presence of the radicals.

Example 12. The method of example 11, where the second pressure is 100 mTorr or lower.

Example 13. The method of one of examples 11 or 12, where generating the first plasma includes applying a RS power pulse to an RS electrode, the RS power pulse having a pulse period between 1 ms to 5 sec.

Example 14. The method of one of examples 11 to 13, where the etch process including: applying a process source (PS) power pulse train to an PS electrode to generate a second plasma in the plasma processing chamber, the PS power pulse train including a plurality of PS power pulses; and applying a bias source (BS) power pulse train to a BS electrode coupled to the substrate within the plasma processing chamber, the BS power pulse train including a plurality of BS power pulses, the BS power pulse train accelerating ions of the second plasma toward to the substrate, the ions etching the recess.

Example 15. The method of one of examples 11 to 14, where the PS power pulse train, the BS power pulse train, or both have a frequency between 1 kHz to 5 kHz.

Example 16. The method of one of examples 11 to 15, where the PS power pulses and the BS power pulses are partially or fully overlapped.

Example 17. The method of one of examples 11 to 16, where the PS power pulse train, the BS power pulse train, or both have a duty cycle between 3% to 20%.

Example 18. A plasma processing system including: a remote source (RS) chamber including a gas inlet, a first electrode coupled to a radio frequency (RF) power source, where the first electrode is configured to generate a first plasma including radicals within the RS chamber, and an exit for the radicals; a plenum attached to the exit of the RS chamber, where the plenum is made of a first thermal conductor, and where walls of the plenum include openings for gas flow; and a plasma process chamber connected to the RS chamber through the plenum, the plasma process chamber including: a substrate holder disposed below the plenum; a gas outlet below the substrate holder; a second electrode coupled to a process power source, the second electrode configured to generate a second plasma; a third electrode coupled to a first bias power source, the third electrode configured to accelerate ions of the second plasma; and process chamber walls including a second thermal conductor, where the process chamber walls of the process chamber are thermally coupled to the walls of the plenum.

Example 19. The plasma processing system of example 18, further including a microprocessor including a program to execute instructions to: apply a first power pulse to the first electrode over a first time duration; and apply a plurality of second power pulses to the second electrode during the second time duration; apply a plurality of third power pulses to the third electrode during the third time duration; and maintain a pressure of the plenum higher than a pressure of the plasma processing chamber.

Example 20. The plasma processing system of one of examples 18 or 19, where the third electrode is further coupled with a second bias power source, where the first bias power source and the second bias source power are configured to apply power pulses to the third electrode at different frequencies.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a substrate, the method comprising:
   generating a remote plasma from a first gas flowing into a remote plasma chamber by applying a first power pulse to a first electrode of the remote plasma chamber over a first time duration; and
   forming a recess in the substrate located in an etching chamber, the forming comprising:
      providing radicals from the remote plasma chamber into the etching chamber;
      applying a plurality of second power pulses to a second electrode of the etching chamber during a second time duration to generate an etch plasma in the etching chamber from a second gas flowing into the etching chamber, the remote plasma chamber being pressurized higher than the etching chamber; and
      applying a plurality of third power pulses to a third electrode of the etching chamber during a third time duration to accelerate ions of the etch plasma,
   wherein the generating the remote plasma comprises applying the first power pulse without applying power pulses to the second electrode or the third electrode.

2. The method of claim 1, further comprising maintaining a pressure of the etching chamber at 100 mTorr or lower while generating the remote plasma and forming the recess.

3. The method of claim 1, further comprising maintaining a pressure of the remote plasma chamber between 100 mTorr to 5 Torr while generating the remote plasma and forming the recess.

4. The method of claim 1, wherein a pulse period of the first power pulse is between 1 ms to 5 sec.

5. The method of claim 1, wherein a pulse period of each of the second power pulses is between 1 μs to 20 μs.

6. The method of claim 1, wherein a pulse period of each of the third power pulses is between 5 μs to 100 μs.

7. The method of claim 1, wherein the first time duration and the second time duration are partially overlapped.

8. The method of claim 1, wherein the plurality of second power pulses and the plurality of third power pulses are not overlapped.

9. The method of claim 1, wherein each pulse in the plurality of second power pulses or the third power pulses comprises a first edge from a first voltage level to a second voltage level, a second edge from the second voltage level to a third voltage level, and a third edge from the third voltage level to the first voltage level, the first edge being separated from the second edge, and the second edge being separated from the third edge.

10. The method of claim 1, further during a fourth time duration, reducing a power level for the second electrode and a power level for the third electrode.

11. A method of processing a substrate in a plasma processing chamber, the method comprising:

flowing a first gas to a remote source (RS) chamber maintained at a first pressure, the RS chamber being connected to the plasma processing chamber;

flowing a second gas to the plasma processing chamber maintained at a second pressure, the second pressure being lower than the first pressure; and performing a cyclic process comprising a plurality of cycles, each cycle of the plurality of cycles comprising:
generating a first plasma of the first gas to generate radicals;
providing the radicals to the plasma processing chamber through sidewalls of a plenum chamber separate from and fluidically coupled to the RS chamber, the plenum chamber comprising a radical ballast region bounded by a bottom wall and the sidewalls; and
performing an etch process in the plasma processing chamber to form a recess in the substrate in the presence of the radicals.

12. The method of claim 11, wherein the second pressure is 100 mTorr or lower.

13. The method of claim 11, wherein generating the first plasma comprises applying an RS power pulse to an RS electrode, the RS power pulse having a pulse period between 1 ms to 5 sec.

14. The method of claim 11, wherein the etch process comprises:
applying a process source (PS) power pulse train to a PS electrode to generate a second plasma in the plasma processing chamber, the PS power pulse train comprising a plurality of PS power pulses; and
applying a bias source (BS) power pulse train to a BS electrode coupled to the substrate within the plasma processing chamber, the BS power pulse train comprising a plurality of BS power pulses, the BS power pulse train accelerating ions of the second plasma toward to the substrate, the ions etching the recess.

15. The method of claim 14, wherein the PS power pulse train, the BS power pulse train, or both have a frequency between 1 kHz to 5 kHz.

16. The method of claim 14, wherein the PS power pulses and the BS power pulses are partially or fully overlapped.

17. The method of claim 14, wherein the PS power pulse train, the BS power pulse train, or both have a duty cycle between 3% to 20%.

18. A method of etching a substrate, the method comprising:
performing a radical generation phase comprising exciting a remote plasma comprising radicals in a pressurized remote plasma chamber by applying a remote source (RS) power pulse to a resonator electrode inductively coupled to the remote plasma;
performing an etch phase after the radical generation phase, the etch phase comprising etching a recess in the substrate located in an etching chamber using the radicals from the remote plasma and ions of an etch plasma by
exciting the etch plasma comprising the ions by applying a pulse train of process source (PS) power pulses to a source electrode capacitively coupled to the etch plasma,
accelerating the ions toward the substrate by applying a pulse train of bias source (BS) power pulses to a substrate holder electrically coupled to the substrate; and
repeating the radical generation phase and the etch phase as a cycle.

19. The method of claim 18, wherein the radical generation phase is performed without applying the PS power pulses to the source electrode and without applying the BS power pulses to the substrate holder.

20. The method of claim 19, wherein the etch phase is performed without applying the RS power pulse to the resonator electrode.

* * * * *